(12) United States Patent
Bair et al.

(10) Patent No.: US 6,393,449 B1
(45) Date of Patent: May 21, 2002

(54) ARBITRARY FUNCTION GENERATOR

(75) Inventors: Samuel S. Bair, Dublin; Jogikal M. Jagadeesh, Columbus; Amir M. Abduljalil, Hilliard, all of OH (US)

(73) Assignee: The Ohio State University Research Foundation, Columbus, OH (US)

( * ) Notice: Subject to any disclaimer, the term of this patent is extended or adjusted under 35 U.S.C. 154(b) by 0 days.

(21) Appl. No.: 09/309,964

(22) Filed: May 11, 1999

(51) Int. Cl.[7] .............................................. G06F 1/02
(52) U.S. Cl. ..................................................... 708/270
(58) Field of Search ............................... 708/270–277; 324/307

(56) References Cited

U.S. PATENT DOCUMENTS

| | | | |
|---|---|---|---|
| 4,706,030 A | 11/1987 | Williard et al. | 324/322 |
| 5,068,786 A | 11/1991 | Netter et al. | 395/825 |
| 5,465,361 A | 11/1995 | Hoenninger, III | 395/700 |
| 5,560,361 A | 10/1996 | Glusick | 128/653.2 |
| 5,588,032 A | 12/1996 | Johnson et al. | 378/8 |
| 5,606,258 A | 2/1997 | Hoenninger, III et al. | 324/309 |
| 5,615,676 A | 4/1997 | Kohno | 128/653.2 |
| 5,754,676 A | 5/1998 | Komiya et al. | 382/132 |
| 5,786,692 A | 7/1998 | Maier et al. | 324/307 |
| 5,883,514 A | 3/1999 | Ishikawa | 324/309 |
| 6,185,594 B1 * | 2/2001 | Hilton et al. | 708/270 |
| 6,259,253 B1 * | 7/2001 | Ellingson | 324/322 |

* cited by examiner

Primary Examiner—Tan V. Mai
(74) Attorney, Agent, or Firm—Standley & Gilcrest LLP

(57) ABSTRACT

An arbitrary function generator produces one or more waveforms for arbitrary applications wherein a general-purpose waveform production capability is customized to meet the demands of specific applications. The arbitrary waveform generator supports arbitrary scaling of waveforms in amplitude and in time. The arbitrary function generator is a standalone system that may be integrated into a MRI control system. In a preferred embodiment of the present invention, a software system comprising a delivery component, a configuration component, a scaling component, and a triggering component provide the features and functions of the present invention. The various software components communicate in accordance with a shared memory database in which data structures comprising waveform descriptions and tuning parameters are made available to the various software components.

22 Claims, 3 Drawing Sheets

ARBITRARY FUNCTION GENERATOR

BACKGROUND OF THE INVENTION

1. Field of the Invention

The present invention relates to arbitrary function generators and the implementation of such function generators in a manner that allows ease of programming and a high degree of interaction with the target application. Specifically, the arbitrary function generator of the present invention provides radio frequency (RF) control and gradient control in a Magnetic an Resonance Imaging (MRI) system.

2. Description of Related Art

In MRI, the subject is placed in a strong static magnetic field and exposed to RF waves. The subject absorbs the RF energy and then re-radiates the RF over a short period. The re-radiated RF signal can be detected and A used to construct an image of the subject. MRI is in general clinical use, but is still an active research area.

To effect imaging, it is necessary to change the magnetic field during the imaging sequence. Special gradient coils are used to produce changes in the magnetic field in the X, Y, and Z dimensions. Gradient amplifiers supply the individual electric currents through the gradient coils. An amplifier's current output is proportional to an external control value that can be changed rapidly. The external control value may be a small voltage or current, or may be supplied directly in digital form. The device used to produce the time varying control value is a function generator.

The generated RF signal must also be precisely controlled in frequency, phase, amplitude, and duration. Typically, a separate frequency synthesizer is used to set the base frequency. Then one or two function generators are used to modulate the frequency and other parameters.

Because the gradient and RF functions control the timing of an MRI sequence, it is often convenient for the functions to be tagged with markers that are then used as triggers for other parts of the system. For example, a marker can be placed in the read gradient function to tell the RF receiver when to begin sampling the input RF signal.

There are a number of commonly used basic sequences of functions for producing images, for example, Spin Echo and Gradient Echo. From these sequences come the logical names often given to the orthogonal gradient dimensions: Read, Phase, and Slice. These logical gradients may be arbitrarily rotated before being applied to the actual gradient devices which are referenced by X, Y, and Z.

For a given subject, each sequence must still be tuned and adjusted in order to get a satisfactory image. More power might be required to necessitating an increase in the RF function amplitude. A particular part of the function may need to be delayed in order to change contrast. The imaging point may have to be moved to home in on a particular anatomical feature. These changes may require the interaction with an operator viewing previous images. The function generator reprogramming time adds to the delay from operator change to image display so that minimizing this time is desirable.

Many function generators rely on hardware implementations so that functions are not easily modified or reprogrammed. Hardware "pre-coding" is commonplace such that a dedicated microprocessor with static RAM may hold the function descriptions that are reused. However, where it was once reasonable for function generators to conserve resources by reusing significant portions of a sequence, some newer sequences are unique end-to-end and have extreme demands for function memory that need to be accommodated. In order to meet minimum requirements, function generators often employ specialized signal processors embedded into the architecture. when the demand for improved performance arises, costly and time-consuming reengineering delays are encountered in engineering the new technology in the hardware.

Magnetic fields in gradients experience memory of their recent history, or hysteresis. It is commonplace in MRI imaging to compensate for this by modifying the control function pattern driving the amplifiers. This is often done in special hardware connected between the function generators and the amplifiers. Once again, the reliance on hardware to perform the functions makes modifications and reprogramming more difficult.

There is a need for a function generator that reduces reliance on hardware dependencies and may be reprogrammed quickly and efficiently. In addition, it is important to provide a user interface that simplifies the description of functions so that the function generator can respond appropriately.

SUMMARY OF THE INVENTION

The present invention, an arbitrary function generator, is an instrument for producing one or more waveforms for arbitrary applications wherein a general-purpose waveform production capability is customized to meet the demands of specific applications. Using the present invention, waveforms may be scaled arbitrarily in amplitude and in time. The arbitrary function generator of the present invention is implemented as a standalone system that may be integrated into a MRI control system. In a preferred embodiment of the present invention, a software system comprising a delivery component, a configuration component, a scaling component, and a triggering component is used to implement the features and functions of the present invention. The various software components communicate in accordance with a shared memory database. Data structures comprising waveform descriptions and tuning parameters are made available to the various software components through the shared memory database.

An operator working at a console may enter waveform descriptions and tuning parameters initially in textual form. The textual waveform descriptions are then translated into binary waveform descriptions. The binary waveform descriptions may be further scaled, rotated, etc. virtually in real-time. The functions related to the waveform descriptions may then be delivered to a hardware synchronization board that controls the device associated with the function generator.

When used in conjunction with a MRI control system, the present invention provides an operator with greater flexibility in configuring new applications and imaging sequences. Using the present invention, an operator is not required to reprogram gradient or RF functions as with prior art systems. The present invention provides an operator with greater control and also dynamic control over the functions as they may be scaled in amplitude and in time and rotated in accordance with operator instructions.

BRIEF DESCRIPTION OF THE DRAWING(S)

DETAILED DESCRIPTION OF THE PREFERRED EMBODIMENT(S)

Figure 1:
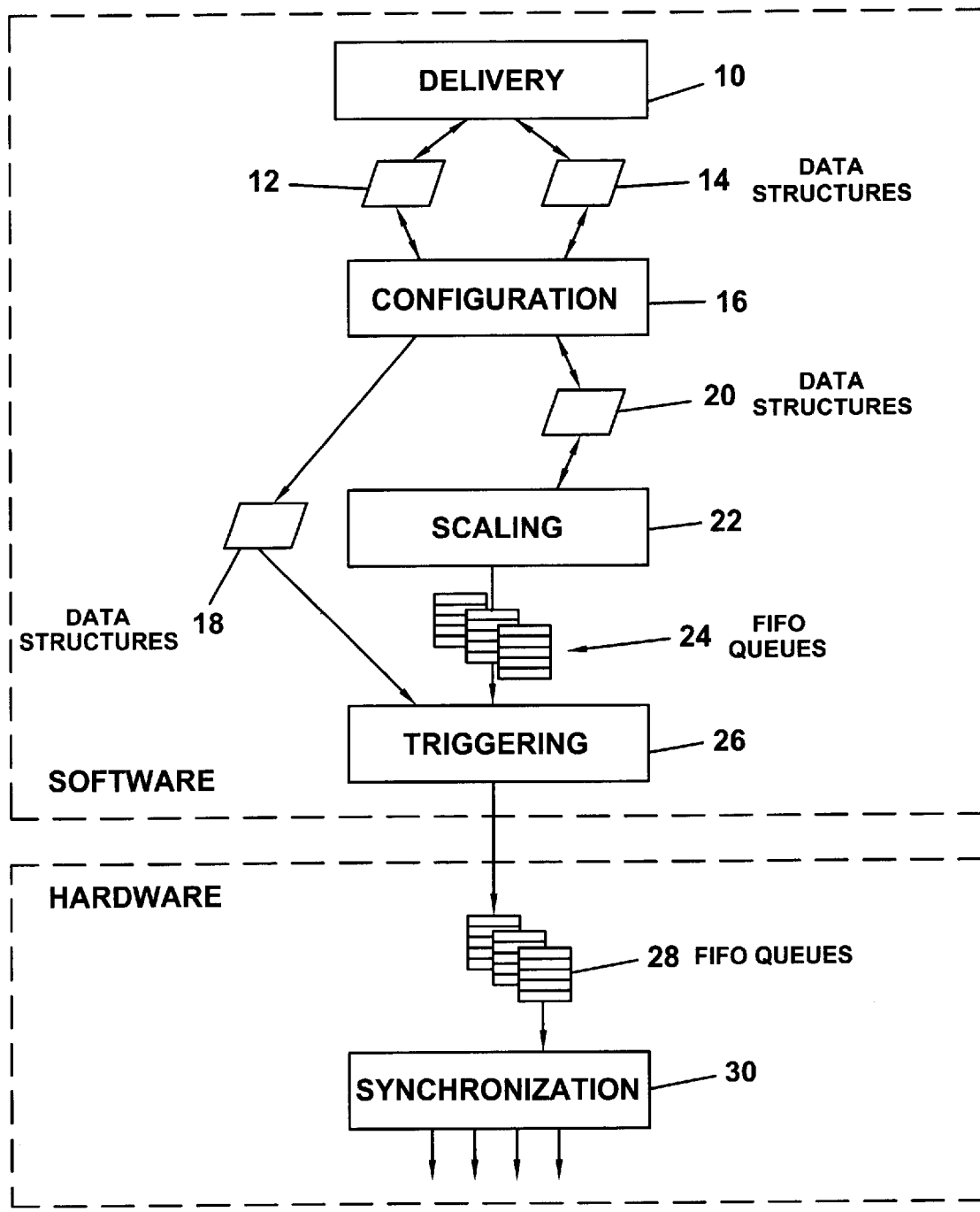
FIG. 1 is a generalized block diagram of the primary components for a preferred embodiment of the present invention.

Referring to FIG. 1, a generalized block diagram of the primary components for a preferred embodiment of the present invention is shown. The present invention is comprised of five primary components: a Delivery component, a Configuration component, a Scaling component, a Triggering component, and a Synchronization component. The Delivery, Configuration, Scaling, and Triggering components, preferably, are implemented in software to allow for greater flexibility and control. The Synchronization component, preferably, is a hardware component.

A Delivery component 10 accepts text waveform descriptions and dynamic tuning parameters from an operator or other source. The text waveform descriptions and dynamic tuning parameters are processed and stored in shared memory data structures 12, 14 for further processing by a configuration component 16.

From shared memory structures 12, 14, a Configuration component 16 configures internal data structures including the translation of textual waveform descriptions into binary (computer internal form) waveform descriptions. The descriptions and tuning parameters may have application specific constructs. The configured waveform descriptions and tuning parameters in the form of binary data structures stored in shared memory 18, 20 are further processed by a Scaling component 22.

From binary waveform descriptions that are in shared memory data structures 18, 20, a Scaling component 22 generates one or more function value streams. Preferably, each stream is partitioned into triggerable sequences or segments such that the last value in a given sequence or segment is tagged with a PAUSE indicator which marks a pause pending receipt of the next trigger, and where the last value of the last sequence or segment is tagged with a STOP indicator, and delivery of the function value streams into FIFO (First In, First Out) queues 24. The binary data structures may have application specific fields.

A Triggering component 26 extracts function values from FIFO queues 24 and processes them in accordance with markers or indicators contained in the stream of function values (e.g., PAUSE, STOP, etc.). The Triggering component implements trigger timing by counting values as they are extracted and, when a PAUSE indicator is detected, inserts filler values until the next trigger time, then resumes extraction from the FIFO queues 24 and delivery of such continuous streams of values to hardware FIFO queues 28 until STOP indicators are encountered. Application specific processing may be included in this step.

A Synchronization component 30 extracts values from multiple hardware FIFO queues 28 and, with synchronization utilizing an external hardware clock pulse, delivers values in digital or analog form to a synchronization board in the device to be controlled.

In a preferred embodiment of the present invention, the Delivery 10, Configuration 16, scaling 22, and Triggering 26 components are implemented in software as separate programs. To facilitate communications between the software components, a shared memory database is used with all programs mapping to the shared memory, with information stored as parameters of several types (integer, integer array, real, real array, text strings, logical), and with the parameters accessed utilizing a subroutine library where the parameters are referenced by name. By using a library call, it is possible to get the address of the actual location in memory where a data item is stored. To create shareable arbitrary binary data structures 18, 20, a database parameter is created which has the desired length. Then, the memory is referenced directly, bypassing the subroutine interface.

Examples of data structures that may be used to implement the features and functions of the present invention are as follows. It is understood that other data structures may be used to facilitate communication between the various components of the present invention.

| | | |
|---|---|---|
| FUNCTION_DESCRIPTOR (array element) | | |
| | DB_ID | structure |
| | FUNCTION_LENGTH | integer |
| | FUNCTION_ADDRESS | address |
| TUNING_DESCRIPTOR (array element) | | |
| | DB_ID | structure |
| | PARAMETER_ADDRESS | address |
| PARSED_SEGMENT_DESCRIPTOR (array element) | | |
| | FUNCTION_FILENAME | string |
| | LABEL | string |
| | AMPLI_SCALER_DB_NAME | string |
| | TIME_SCALER_DB_NAME | string |
| | REPEAT_START_LABEL | string |
| | REPEAT_END_LABEL | string |
| | FLAGS | |
| |     PAUSE | bit |
| |     STOP | bit |
| |     MARK1 | bit |
| |     MARK1E | bit |
| RUN_SEGMENT_DESCRIPTOR (array element) | | |
| | FUNCTION_LENGTH | integer |
| | FUNCTION_ADDRESS | address |
| | AMPL_SCALER_ADDRESS | address |
| | TIME_SCALER_ADDRESS | address |
| | FLAGS | |
| |     PAUSE | bit |
| |     STOP | bit |
| |     MARK1 | bit |
| |     MARK1E | bit |
| GRADIENT_FIFO | | |
| | FIFO_LENGTH | integer |
| | READ_INDEX | integer |
| | WRITE_INDEX | integer |
| | FLAGS[] | integer array |
| |     PAUSE | bit |
| |     STOP | bit |
| |     MARKER1 | bit |
| X[] | | real array |
| Y[] | | real array |
| Z[] | | real array |

In the Delivery component 10, a supervisory control program operates the gradient instrument by writing values to database parameters. The control program may reside on the same computer system as the gradient instrument system, or it may reside on a separate networked computer. In the latter case, special delivery agent programs using TCP/IP messages move parameter values between the computers. The parameters may change dynamically so that functions do not have to be reprogrammed. For example, parameters may be changed quickly and easily at the beginning of a new imaging sequence.

Preferably, the following database parameters are created when the system is started with the given initial values (names starting with $ are local to the gradient system):

| Name | Type | Initial value |
| --- | --- | --- |
| GRADIENT_CONTROL | logical | DONE |
| $SCALE_CONTROL | logical | DONE |
| $TRIGGER | string | " " |
| GR_READ | string | " " |
| GR_PHASE | string | " " |
| GR_SLICE | string | " " |
| GR_ROLL | real | 0.0 |
| GR_PITCH | real | 0.0 |
| GR_YAW | real | 0.0 |
| $ROTATION | real array[3,3] | 1.0 0.0 0.0 |
| | | 0.0 1.0 0.0 |
| | | 0.0 0.0 1.0 |
| GR_TRIGGER | logical | SOFTWARE |
| GR_EXT_TRIG_ENABLE | logical | NO |
| $TRIGGER_ENABLE | logical | YES |
| GR_PREEMPHASIS | logical | NO |
| GR_PREEMPH_A | real array[4, 3, 16] | all 0s |

Additional local and global Database parameters are created to satisfy tuning parameter references from within the GR_READ, GR_PHASE, and GR_SLICE function descriptions as described below.

Preferably, the gradient or waveform descriptions (GR_READ, GR_PHASE, GR_SLICE) are text strings which describe functions as a series or collection of segment descriptions separated with the symbol "+" as follows:

segment+segment+. . .

The descriptions and associated tuning parameters may be entered by an operator who types in the text through a keyboard and console. Parameters and descriptions may be saved in files that the operator may access later for specific or custom applications. Other devices and user interfaces may facilitate the process of receiving input from an operator. For example, an operator may use a trackball to effect changes to tuning parameters in real-time. Alternatively, an operator may interact with a graphical user interface comprising a variety of controls for specifying tuning parameters and descriptions. Once completed, the descriptions are sent to the Delivery component 10 for processing. A simple segment description contains the name of the file which has a series of values which are the normalized amplitudes of a waveform and the names of two database parameters that are used to scale the waveform in amplitude and time.

A segment in the most general way is described by filename /label/ amplitude duration PAUSE STOP application_specific_keywords or REPEAT /label1/ /label2/ number_of_repetitions where:

| | |
| --- | --- |
| filename | Names a file containing a textual description of the waveform as an arbitrary number of values in the range +− 1.0. If the keyword REPEAT is used in place of the filename, the segments from label1 to label2 are repeated the number_of_repetitions times. |
| /label/ | Provides a way for application specific keys to reference segments. |
| amplitude | A constant in the range +− 1.0 or the name of a database real-valued parameter which may be adjusted over the range +− 1.0. This is used to scale the amplitude of the function where 1.0 represents full scale. |
| duration | A constant with range >= 1.0 or the name of an integer- or real-valued parameter which can be adjusted over the range >= 1.0. This is used to scale the function in time. For the MRI gradient and MRI RF application the values represent microseconds. |

-continued

| | |
| --- | --- |
| PAUSE | This keyword means that after this segment, the function is not played out further until a trigger is received. |
| STOP | This keyword means that the full sequence is completed. |
| OFFSET amplitude | The indicated amplitude is added to the function value after scaling and step-scaling are applied. The amplitude is specified as a constant or database parameter as previously described. |

To handle some special cases in MRI where waveforms are repeated, e.g., phase gradients are scaled as a function of a row, the following are defined. When a REPEAT function is used, each repetition has an implied repeat index in the range 0–(N−1).

| | |
| --- | --- |
| EVERY nnn | The repeat index is divided by nnn. |
| ISTEP /file/ | Label is the name of an integer array indexed with the repeat index and producing a new repeat index. |
| FSTEP | The function described by filename is actually the concatenation of number_of_repetitions separate functions. The correct function is selected by the repeat index. |
| STEP | Must be supplied if stepping and EVERY, ISTEP, or FSTEP not used to indicate step scaling being done. When stepping, the amplitude scalar is itself scaled by 1 - (2 * repeat_index / repeat_count). |
| M1 | Insert marker1 at beginning |
| M1E | or end of segment. |
| M2 | Insert marker2 at beginning |
| M2E | or end of segment. |
| M3 | Insert marker3 at beginning |
| M3E | or end of segment. |
| M4 | Insert marker4 at beginning |
| M4E | or end of segment. |

As defined herein, the descriptions that may be provided are sufficient to generate functions and triggering in software by resuming functions at the appropriate time.

In the Configuration component 16, if GR_READ, GR_PHASE, GR_SLICE have been modified, then a structural reconfiguration may be performed as described in the following. The Configuration component 16 parses GR_READ, GR_PHASE, and GR_SLICE gradient descriptions into three arrays of PARSED_SEGMENT_DESCRIPTORs that directly correspond to the textual descriptions, but are in binary form for easier processing in the following steps.

The PARSED_SEGMENT_DESCRIPTORs are then scanned. For each file specified, a database array is created and initialized with the values from the file, and a FUNCTION_DESCRIPTOR entry is created with information on finding the database array. The PARSED_SEGMENT_DESCRIPTORs are scanned again. For each amplitude scalar or time scalar, a TUNING_DESCRIPTOR entry is created which points to a database tuning parameter.

At this point, all information required to build the runtime READ, PHASE, and SLICE segment descriptions is known. The PARSED_SEGMENT_DESCRIPTORs are scanned and RUN_SEGMENT_DESCRIPTOR entries are created so that there is an entry for each independently adjustable segment. Where repeating segment ranges have been specified, a separate RUN_SEGMENT_DESCRIPTOR entry is created for each repetition.

If any of GR_ROLL, GR_PITCH, or GR_YAW have been modified, a new rotation matrix is computed and stored in the 3×3 real array $ROTATION. This will be used by the Scaling component 22 to rotate the read, phase, and slice gradients before applying them to the x, y, and z gradient coils. The 3×3 matrix may be derived as follows:

| | | |
|---|---|---|
| cosYcosR | −cosYsinR | sinY |
| cosPsinR+sinPsinYcosR | cosPcosR−sinPsinYsinR | −sinPcosY |
| sinPsinR−cosPsinYcosR | sinPcosR+cosPsinYsin | cosPcosY | where R is roll angle (rotate around slice axis), P is pitch angle (rotate around read axis), Y is yaw angle (rotate around phase axis).

The Scaling component 22 steps through the three RUN_SEGMENT_DESCRIPTOR arrays performing the indicated amplitude and time scaling. As many output values are generated as required to achieve the desired time duration with the clocking rate used by the synchronizing step described below. Each time step produces a read, phase, and slice value. If a PAUSE flag is encountered for one of the segments in an array, then the last value is repeated until all of the arrays are detected in PAUSE state at which time processing advances to the next segment for all three arrays concurrently.

The values are rotated by multiplying the 1×3 (read, phase, write) array by the 3×3 rotation matrix to get a 1×3 array (X, Y, Z).

The Scaling component 22 stops sequence playout (i.e., stops filling the software FIFO queues 24) when the Read, Phase, and Select sequences are PAUSED and at least one of Read, Phase, or Select is STOPPED.

The objects of the Triggering component 26 are twofold. First, partial sequences that pause awaiting triggers are expanded into continuous streams. Second, algorithms which depend on seeing this continuous stream of values are executed, specifically a gradient preemphasis filter function.

Normally, when values are extracted from the X, Y, Z, and Flag FIFO queues 28, the read pointer is advanced. If the FIFO Flag PAUSED is set, the read pointer is NOT advanced. Because each extracted value is to be played out by hardware at a fixed clock rate, time may be tracked by counting samples. Before each extraction, a check is made to see if the trigger time has arrived, and, if so, and triggers are enabled, the read pointer is advanced. Triggers may be permanently enabled in which case the effect is to have triggering at a uniform rate. Alternatively, the trigger enable may be bound to an external event, such as the expansion of a patient's chest cavity by a certain amount. In the latter case, the trigger time then becomes the minimum time between triggers.

The trigger time may be set from a database parameter at the start of each imaging sequence. Preferably, the parameter is locally scaled to reflect the time per value. For example, if the gradient system is to deliver a sample every 4 microseconds and TR contained 3000 milliseconds, then the TRIGGERING program effectively triggers every 3000 milliseconds*1000 microseconds/millisecond*1 sample/4 microsecond=750,000 samples.

The values are then delivered to the Synchronization component 30. In a preferred embodiment of the present invention, the Synchronization component 30 comprises a synchronization board. The output function values are delivered synchronously with an externally supplied clock pulse. The gradient amplifiers are then controlled in accordance with the descriptions and tuning parameters that have been entered by an operator.

Figure 2:
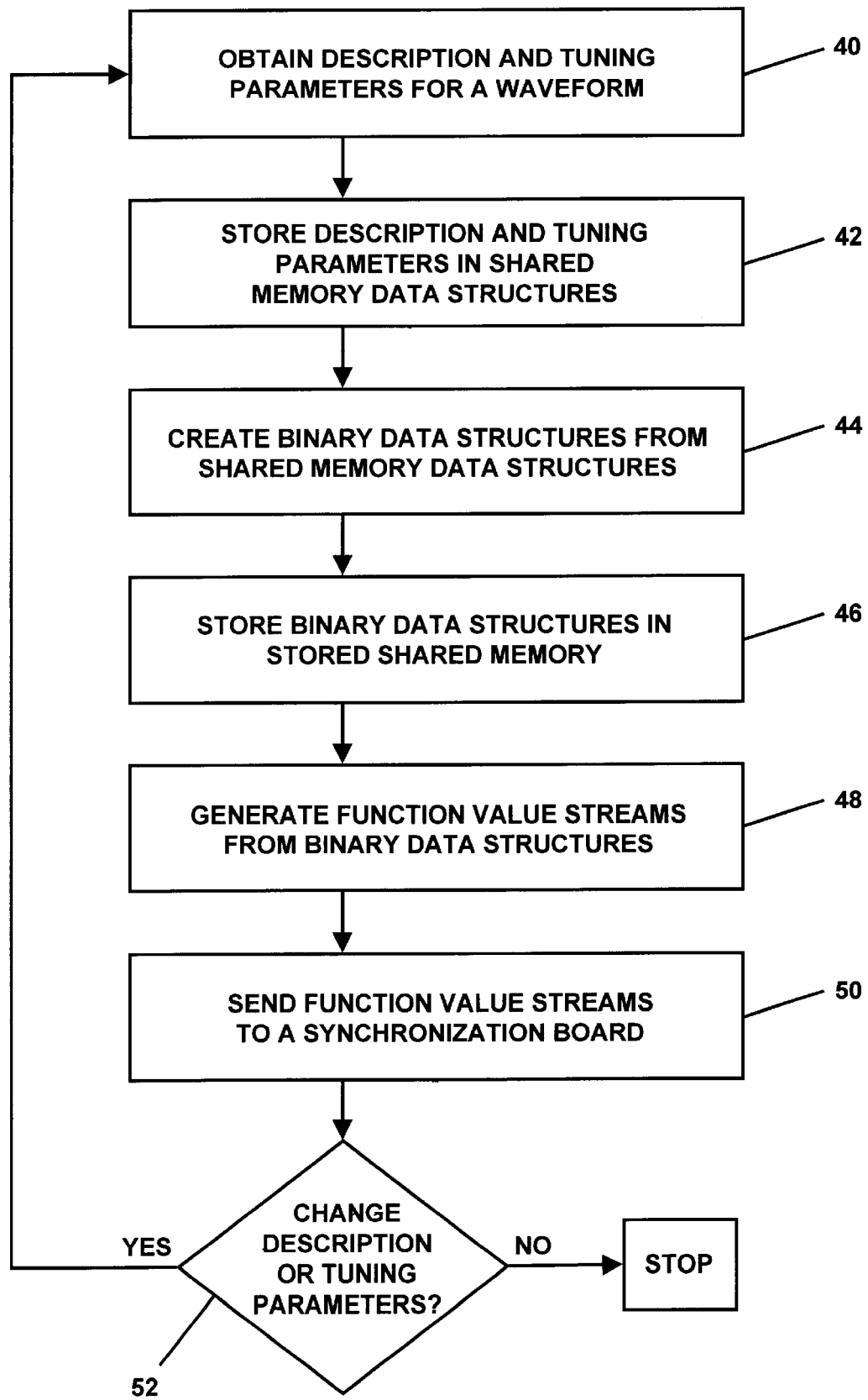
FIG. 2 is a flow chart of the primary steps for performing the method of the present invention.

Referring to FIG. 2, a flow chart of the primary steps of the method of the present invention is shown. First, in step 40, a description and tuning parameters for a waveform are obtained, for example, from an operator typing text at an operator's console. In the next step 42, the description and tuning parameters are stored in shared memory data structures. In step 44, binary data structures are created from the shared memory data structures. The binary data structures are also stored in shared memory in step 46. In step 48, function value streams are generated from the binary data structures and in step 50, are sent to a synchronization board. In step 52, the operator has the option of changing the description or tuning parameters in order to generate different function value streams. If the operator chooses to change the description or tuning parameters at step 52, the process begins again at step 40 and the data structures in shared memory are modified accordingly. The operator may enter new tuning parameters to generate new function value streams. No reprogramming is required to change the functions as new function value streams will be generated based on the old descriptions and the new tuning parameters entered by the operator or obtained from another source.

Figure 3:
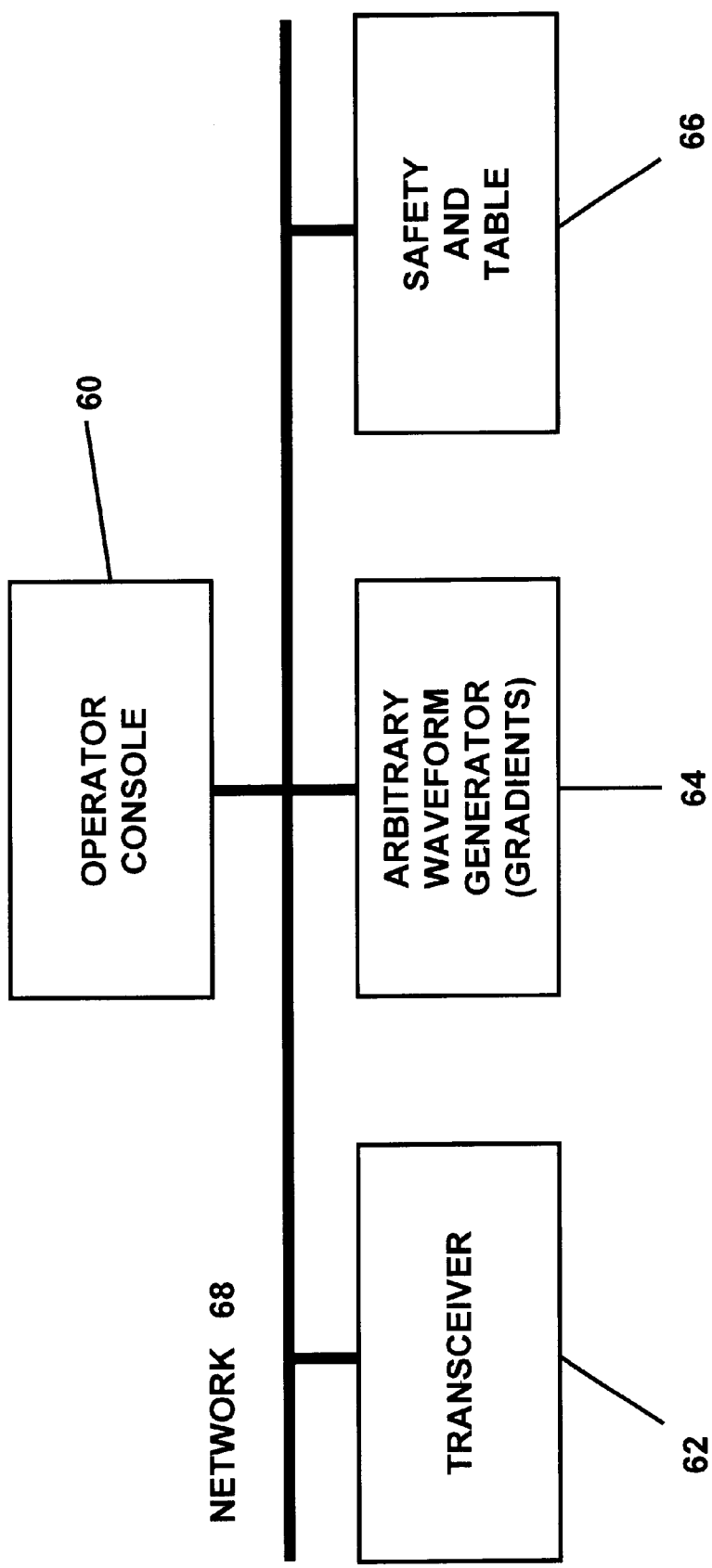
FIG. 3 is a block diagram of a MRI control system in which the present invention has been incorporated.

Referring to FIG. 3, a MRI control system in which the present invention has been incorporated is shown. As shown in FIG. 3, the MRI control system may be comprised of an independent Operator Console 60, Transceiver 62, Arbitrary Function Generator 64, and Safety and Table 66 that communicate in accordance with a network 68. The Operator Console 60 may be used to obtain the textual descriptions that are processed by the Arbitrary Function Generator 64 in accordance with the methods and system of the present invention. The Arbitrary Function Generator 64 provides information to the Transceiver 62 in accordance with the methods and system of the present invention. The partitioning as shown allows each module or subsystem to function independently of the other modules or subsystems so that processing requirements of each may be addressed independently. Other partitionings of the various functions may be used as well.

While the invention is described using particular examples, it should be noted that these examples are for the purpose of explanation only and not as limitations on the invention which is defined by the accompanying claims.

What is claimed is:

1. A system for generating functions, comprising:
 a delivery component for accepting waveform descriptions and tuning parameters;
 a first shared memory database for storing said waveform descriptions and tuning parameters;
 a configuration component for translating said waveform descriptions and tuning parameters into binary data structures;
 a second shared memory database for storing said binary data structures;
 a scaling component for generating at least one function value stream from said binary data structure;
 a triggering component for processing said at least one function value stream in accordance with markers in said at least one function value stream; and
 a synchronization component for accepting said at least one function value stream processed by said triggering component.

2. The system of claim 1 wherein said functions are gradient and RF functions for controlling a MRI system.

3. The system of claim 1 wherein said binary data structures describe a waveform as a collection of segment descriptors.

4. The system of claim 3 wherein said segment descriptors comprise a pointer to a normalized waveform comprising an arbitrary number of digital values, said segment descriptors also comprising pointers to values used to scale said waveform in amplitude and time, said descriptors comprising various markers, one of said markers being used as a flag to signal a pause until triggered.

5. The system of claim 1 wherein said function value streams provide control for logical X, Y, and Z axis gradients.

6. The system of claim 1 wherein said tuning parameters are combined with said function value streams to effect rotation to produce output streams for physical X, Y, and Z gradients.

7. The system of claim 1 wherein said triggering component buffers said function value streams.

8. The system of claim 1 wherein said triggering component processes said function value streams without pause markers using values from said function value streams from the time of triggering until a pause flag is encountered, and supplying filler values from the point said function value streams stop until a next trigger is effected.

9. A method for generating functions comprising the steps of:

(a) obtaining a description and tuning parameters for a waveform;

(b) storing said description and tuning parameters in data structures;

(c) creating binary data structures from said data structures;

(d) generating function value streams from said binary data structures; and (e) sending said function value streams to a synchronization board.

10. The method of claim 9 wherein said step of obtaining a description and tuning parameters comprises the step of entering a textual description and tuning parameters at an operator console.

11. The method of claim 9 further comprising the steps of:

(f) obtaining a new description and tuning parameters; and (g) generating new function value streams based on said new description and tuning parameters.

12. The method of claim 9 further comprising the step of storing said data structures and binary data structures in a shared memory database.

13. The method of claim 9 further comprising the step of partitioning said function value streams into triggerable sequences.

14. The method of claim 9 wherein the step of sending said function value stream to a synchronization board comprises the steps of delivering said function value streams to first in, first out queues.

15. An arbitrary waveform generator, comprising:

a delivery component adapted to receive textual waveform descriptions and tuning parameters;

a configuration component adapted to translate said textual waveform descriptions and tuning parameters into binary waveform descriptions;

a scaling component adapted to generate function value streams from said binary waveform descriptions, said function value streams comprising markers for partitioning said function value streams into triggerable segments;

a triggering component adapted to process said function value streams into queues in accordance with said markers; and a synchronization component for extracting said function value streams in said queues and delivering values in said function value streams to a synchronization board.

16. The arbitrary waveform generator of claim 15 further comprising a shared memory database for storing said textual and binary waveform descriptions and said tuning parameters.

17. The arbitrary waveform generator of claim 15 wherein said scaling component is adapted to scale said binary waveform descriptions in amplitude.

18. The arbitrary waveform generator of claim 15 wherein said scaling component is adapted to scale said binary waveform description in time.

19. The arbitrary waveform generator of claim 15 wherein said function value streams comprise gradient and RF functions for controlling a MRI system.

20. The arbitrary waveform generator of claim 15 wherein said function value streams control for logical X, Y, and Z axis gradients.

21. The arbitrary waveform generator of claim 15 wherein said tuning parameters are combined with said function value streams to effect rotation to produce output streams for physical X, Y, and Z gradients.

22. The arbitrary waveform generator of claim 15 wherein said delivery component is adapted to receive said textual waveform descriptions and tuning parameters from an operator at a console.

* * * * *

UNITED STATES PATENT AND TRADEMARK OFFICE
CERTIFICATE OF CORRECTION

PATENT NO. : 6,393,449 B1  
DATED : May 21, 2002  
INVENTOR(S) : Stuart Collins, Jr.

It is certified that error appears in the above-identified patent and that said Letters Patent is hereby corrected as shown below:

<u>Column 1,</u>
Line 18, please delete the word "A" found between the words "and" and "used".

<u>Column 2,</u>
Line 5, please delete the word "when" and replace it with the word -- When --.

Signed and Sealed this

Third Day of September, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO. : 6,393,449 B1
DATED : May 21, 2002
INVENTOR(S) : Bair et al.

It is certified that error appears in the above-identified patent and that said Letters Patent is hereby corrected as shown below:

Column 1,
Line 18, please delete the word "A" found between the words "and" and "used".

Column 2,
Line 5, please delete the word "when" and replace it with the word -- When --.

Signed and Sealed this

Seventh Day of January, 2003

JAMES E. ROGAN
*Director of the United States Patent and Trademark Office*